United States Patent
Choi

(10) Patent No.: US 9,704,890 B2
(45) Date of Patent: Jul. 11, 2017

(54) DISPLAY SUBSTRATE INCLUDING DIRECT CONTACT PART AND METHOD OF FABRICATING THE SAME

(71) Applicant: Samsung Display Co., Ltd., Yongin (KR)

(72) Inventor: Young-Joo Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/725,993

(22) Filed: May 29, 2015

(65) Prior Publication Data

US 2016/0064412 A1 Mar. 3, 2016

(30) Foreign Application Priority Data

Aug. 27, 2014 (KR) ........................ 10-2014-0112344

(51) Int. Cl.
*H01L 29/04* (2006.01)
*H01L 27/12* (2006.01)
*H01L 29/24* (2006.01)

(52) U.S. Cl.
CPC ........ *H01L 27/124* (2013.01); *H01L 27/1225* (2013.01); *H01L 29/24* (2013.01)

(58) Field of Classification Search
CPC .............. H01L 27/124; H01L 27/1225; H01L 27/1259; H01L 29/7869; H01L 29/66969;
(Continued)

(56) References Cited

U.S. PATENT DOCUMENTS 6,414,730 B1 7/2002 Akamatsu
7,872,722 B2 1/2011 Kimura
(Continued)

FOREIGN PATENT DOCUMENTS

KR 10-2000-0029304 5/2000
KR 10-2003-0058237 7/2003
(Continued)

OTHER PUBLICATIONS

Non-Final Office Action dated Feb. 1, 2016 in U.S. Appl. No. 14/753,867.
(Continued)

*Primary Examiner* — Hung Vu
(74) *Attorney, Agent, or Firm* — H.C. Park & Associates, PLC

(57) ABSTRACT

A display substrate including a lower common electrode disposed on a substrate, an insulating layer disposed on the lower common electrode, a gate pattern including a gate electrode disposed on the insulating layer and a common electrode contact part and a direct contact part spaced apart from the gate electrode, a gate insulating layer disposed on the gate pattern, a semiconductor layer disposed on the gate insulating layer, an etch stopping layer disposed on the gate insulating layer, source and drain electrodes disposed on the etch stopping layer, pixel part extending from the source and drain electrodes, a first conductive layer connected to the common electrode contact part, a second conductive layer connected to the direct contact part, and a passivation layer disposed on the source and drain electrodes, the first conductive layer, and the second conductive layer.

13 Claims, 4 Drawing Sheets

(58) Field of Classification Search
CPC ......... H01L 29/42356; H01L 29/42384; H01L 29/45; H01L 29/4908; H01L 29/495; H01L 29/4966; H01L 21/441
USPC .................................................... 257/59, 72
See application file for complete search history.

(56) References Cited

U.S. PATENT DOCUMENTS

| | | |
|---|---|---|
| 2008/0136990 A1 | 6/2008 | Kimura |
| 2011/0024758 A1* | 2/2011 | Kimura ............. G02F 1/134363 257/59 |
| 2011/0050551 A1 | 3/2011 | Ota et al. |
| 2011/0310341 A1 | 12/2011 | Kim et al. |
| 2013/0119392 A1 | 5/2013 | Park et al. |
| 2015/0235585 A1 | 8/2015 | Kim et al. |
| 2016/0062198 A1 | 3/2016 | Wang et al. |
| 2016/0064414 A1 | 3/2016 | Choi |
| 2016/0064420 A1 | 3/2016 | Choi |

FOREIGN PATENT DOCUMENTS

| | | |
|---|---|---|
| KR | 10-2011-0040167 | 4/2011 |
| KR | 10-2012-0125823 | 11/2012 |

OTHER PUBLICATIONS

Non-Final Office Action dated Apr. 28, 2016 in U.S. Appl. No. 14/731,272.
Final Office Action dated Jun. 13, 2016 in U.S. Appl. No. 14/753,867.
Final Office Action dated Aug. 4, 2016 in U.S. Appl. No. 14/731,272.
Non-Final Office Action dated Dec. 1, 2016 in U.S. Appl. No. 14/731,272.
Notice of Allowance dated Oct. 3, 2016 in U.S. Appl. No. 14/753,867.
Notice of Allowance dated Jan. 20, 2017 in U.S. Appl. No. 14/753,867.

* cited by examiner

DISPLAY SUBSTRATE INCLUDING DIRECT CONTACT PART AND METHOD OF FABRICATING THE SAME

CROSS-REFERENCE TO RELATED APPLICATION

This application claims priority from and the benefit of Korean Patent Application No. 10-2014-0112344, filed on Aug. 27, 2014, which is hereby incorporated by reference for all purposes as if fully set forth herein.

BACKGROUND

Field

Exemplary embodiments of the present invention relate to a display substrate and a method of fabricating the same. More particularly, exemplary embodiments of the present invention relate to a display substrate including a direct contact part (D-CNT) using an etch stopper scheme and reducing the number of photo masks used in the fabrication of the display substrate for a liquid crystal display device in a Plane Line Switching (PLS) mode.

Discussion of the Background

A liquid crystal display device displays an image by adjusting light transmittance of liquid crystals through an electric field. The liquid crystal display device may include a liquid crystal panel, in which liquid crystal cells are arranged in a matrix form, and a driving circuit for driving liquid crystals.

The liquid crystal panel may include a display substrate forming a thin film transistor array, a color filter substrate forming a color filter array, and liquid crystals interposed between the two substrates.

In the liquid crystal panel, the liquid crystal cells may be arranged in regions where gate lines and data lines cross. Each of the liquid crystal cells may form a pixel electrode and a common electrode, to which an image data signal and a common voltage is applied, respectively. Further, a thin film transistor connected to the gate line, the data line, and the pixel electrode may be formed in the liquid crystal cells, so that when a scan signal is supplied to the gate line, the data line supplies the image data signal to the pixel electrode in order to display an image.

The liquid crystal display device may be classified into a vertical field mode liquid crystal display device and a horizontal field mode liquid crystal display device depending on a direction of the electric field.

The liquid crystal display device has been developed because a wide viewing angle for the vertical field mode liquid crystal display may be deteriorated. Particularly, research has been conducted for reducing manufacturing cost of a Plane to Line Switching (PLS) mode liquid crystal display device which is a type of horizontal field mode liquid crystal display device.

An inverted staggered structure of a bottom gate may be used for fabrication of the display substrate, since its manufacturing process may be relatively simple, and does not require a separate light blocking layer. A thin film transistor having the inverted staggered structure may be classified into a Back Channel Etched (BCE) scheme thin film transistor, which may be used for simplifying a manufacturing process, and an Etch Stopper (ES) scheme thin film transistor, which may be used for improving a characteristic of the thin film transistor, depending on a manufacturing process of forming a channel.

The BCE scheme may be used to etch an ohmic contact layer after forming a data pattern in order to decrease the number of masks used and continuously fabricate a gate insulating layer, a semiconductor layer, and the ohmic layer within the same chamber. However, in order to completely remove the ohmic contact layer of a channel part, over-etching may be required, which may require forming a thick semiconductor layer to secure a margin. Accordingly, an increase in processing time, a leakage current, and a serial contact resistance of the thin film transistor may occur, and a decrease in electron mobility of the liquid crystal device may also occur.

The ES scheme may form a thin semiconductor layer, but may require patterning an etch stopper, which may require an additional mask process.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display substrate that includes a direct contact part (D-CNT) while using an etch stopper scheme, and decreasing the number of photo masks when fabricating the display substrate used in a Plane to Line Switching (PLS) liquid crystal display device.

Additional aspects of the inventive concept will be set forth in the detailed description which follows, and, in part, will be apparent from the disclosure, or may be learned by practice of the inventive concept.

According to an exemplary embodiment of the present invention, a display substrate includes a lower common electrode disposed on a substrate, an insulating layer disposed on the lower common electrode, a gate pattern including a gate electrode disposed on the insulating layer and the common electrode contact part and a direct contact part spaced apart from the gate electrode, a gate insulating layer disposed on a substrate including the gate pattern, a semiconductor layer disposed on the gate insulating layer, an etch stopping layer disposed on the gate insulating layer, source and drain electrodes disposed on the etch stopping layer, a pixel part extending from the source and drain electrodes, and a first conductive layer connected to the common electrode contact part, a second conductive layer connected with the direct contact part, a passivation layer disposed on the source and drain electrodes, the first conductive layer, and the second conductive layer.

The lower common electrode may be deposited on the substrate covering the entire substrate without being patterned.

The lower common electrode and the pixel part may include a transparent conductive oxide (TCO)-based metal.

The insulating layer and the gate insulating layer may include a Si-based insulating layer.

The gate electrode may include at least one of copper, aluminum, molybdenum, tungsten, titanium, chrome, and an alloy thereof.

The source and drain electrodes may include copper and a copper lower barrier including a TCO wire.

According to an exemplary embodiment of the present invention, a method of fabricating a display substrate includes depositing a lower common electrode on a substrate, depositing an insulating layer on the lower common electrode, depositing a gate metal on the insulating layer, patterning the gate metal to form a gate pattern including a gate electrode, a common electrode contact part, and a direct contact part, forming a gate insulating layer on the gate pattern, depositing a semiconductor material on the gate insulating layer, patterning the semiconductor material to form a semiconductor layer, depositing an etch stopping layer on the gate insulating layer, patterning the etch stopping layer to form a first, a second, a third, a fourth contact holes in a source region, a drain region, the common electrode contact part, and the direct contact part, respectively, depositing a source/drain metal on the source region, the drain region, and a pixel part, patterning the source/drain metal to form a source electrode and a drain electrode, a first conductive layer, and a second conductive layer on the first, the second, the third, and the fourth contact holes, depositing a passivation layer on the source electrode, the drain electrode, the first conductive layer, the second conductive layer, and patterning the passivation layer to expose the pixel part.

The source/drain metal may include copper and a TCO wire, the copper being selectively wet etched so that the TCO wire remains in the pixel part when exposing the pixel part.

In patterning the passivation layer, the common electrode contact part may side contacts with the lower common electrode through a pixel metal.

The lower common electrode may entirely cover the substrate without being patterned.

According to exemplary embodiments of the present invention, the number of photo masks used when adopting an etch stopper scheme may be reduced.

Further, a direct contact part (D-CNT) may be formed without increasing the number of photo masks, thereby implementing a narrow bezel.

Further, a semiconductor layer may be separately patterned, so that a half tone (HT) mask may not be required when source/drain electrodes are patterned.

Further, when patterning source/drain electrodes, a pixel part may be formed by by a Cu/TCO wire.

Further, the common electrode may be entirely deposited, thereby decreasing a defect caused by static electricity.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
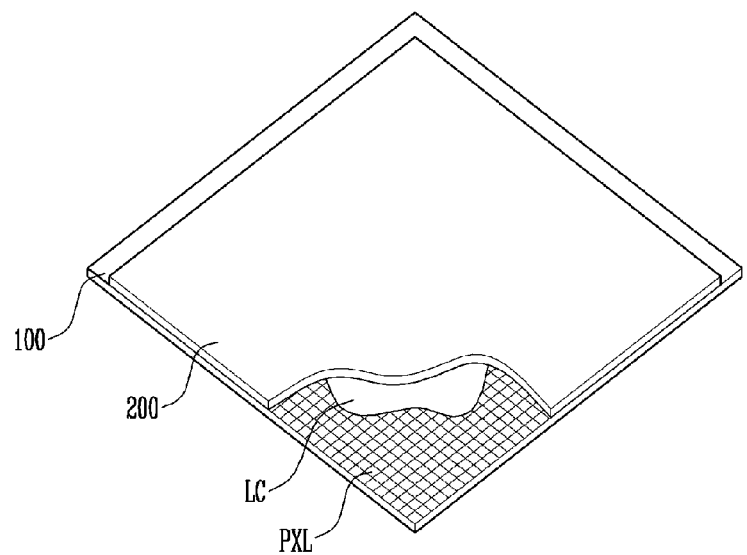
FIG. 1 is a schematic view illustrating a display device including a display substrate according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic view illustrating a display device including a display substrate according to an exemplary embodiment of the present invention.

Referring to FIG. 1, the display device includes a display substrate 100 including pixels PXL, an opposing substrate 200 opposite to the display substrate 100, and a liquid crystal layer LC disposed between the display substrate 100 and the opposing substrate 200.

Each pixels of the display substrate 100 may include at least one thin film transistor, a pixel electrode, and a common electrode for driving liquid crystal molecules. The opposing substrate 200 may include color filters to display colors of an image.

The liquid crystal layer LC includes liquid crystal molecules having dielectric anisotropy. When an electric field is applied between the pixel electrode and the common electrode of the display substrate 100, the liquid crystal molecules of the liquid crystal layer LC rotates in a specific direction between the display substrate 100 and the opposing substrate 200, and adjusts transmittance of light incident to the liquid crystal layer LC.

Figure 2:
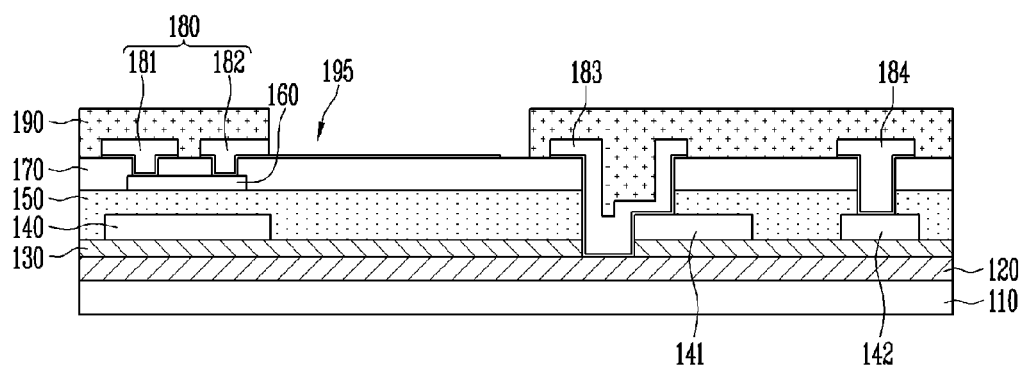
FIG. 2 is a cross-sectional view illustrating the display substrate according to an exemplary embodiment of the present invention.

FIG. 2 is a cross-sectional view of the display substrate according to an exemplary embodiment of the present invention. FIGS. 3A, 3B, 3C, 3D, 3E, 3F, 3G, and 3H are schematic diagrams illustrating a process of fabricating the display substrate according to an exemplary embodiment of the present invention.

Referring to FIG. 2, the display substrate 100 includes an insulating substrate 110 including pixel areas, a lower common electrode 120, a gate electrode 140, a source and a drain electrode 180, and a pixel part 195. Each pixel PXL has the same structure, so that, for convenience of the description, FIG. 2 illustrates one pixel PXL, among the pixels of FIG. 1.

Figure 3A:
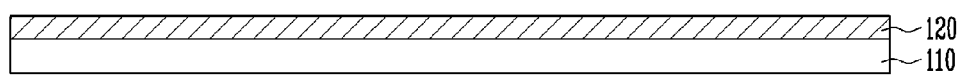
FIGS. 3A, 3B, 3C, 3D, 3E, 3F, 3G, and 3H are schematic diagrams illustrating a process of fabricating the display substrate according to an exemplary embodiment of the present invention.

Referring to FIGS. 2 and 3A, the insulating substrate 110 may be formed of a transparent insulating material. Pixel areas may be disposed on the insulating substrate 110 in a matrix form.

The lower common electrode 120 may be disposed on the insulating substrate 110. The lower common electrode 120 may be deposited on the insulating substrate 110 to cover the entire insulating substrate 110, while the lower common electrode 120 is not patterned. Depositing the lower common electrode 120 on the entire insulating substrate 110 may have a substantially similar effect to that of depositing a metal on a rear surface, which may decrease static electricity as a potential difference between the gate line and the data line decreases.

The lower common electrode 120 may include a transparent conducting oxide (TCO) based material, for example, indium zinc oxide (IZO) and indium tin oxide (ITO). The lower common electrode 120 may be formed by, for example, sputtering or Chemical Vapor Deposition (CVD).

Figure 3B:
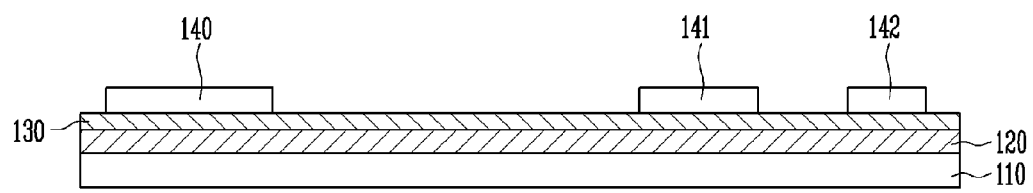

Referring to FIG. 3B, an insulating layer 130 is disposed on the lower common electrode 120. A Si-based material, for example, SiNx, SiOx, or SiONx, may be used as the insulating layer 130, and the insulating layer 130 may be formed by, for example, sputtering or CVD.

The insulating layer 130 separates the lower common electrode 120 and the gate electrode 140.

A gate pattern including the gate line GL and the gate electrode 140 are disposed on the insulating layer 130. Further, a common electrode contact part (com-CNT) 141 and a direct contact part (D-CNT) 142 are disposed on the insulating layer 130 while being spaced apart from the gate electrode 140.

The gate pattern, the common electrode contact part (com-CNT) 141, and the direct contact part (D-CNT) 142 may be formed by using the same gate forming material.

The common electrode contact part (com-CNT) 141 and the direct contact part (D-CNT) 142 disposed on the same layer as that of the gate electrode 140 may be simultaneously formed when the gate electrode 140 is patterned. The direct contact part (D-CNT) 142 may implement a narrow bezel.

The common electrode contact part (com-CNT) 141 and the direct contact part (D-CNT) 142 may be formed by pattering the gate electrode 140 by using photoresist as a first mask (not illustrated). The gate electrode 140 may be patterned by, for example, dry etching or wet etching.

A metal such as copper, aluminum, molybdenum, tungsten, and chrome, may be used as a gate material to form the gate line GL, the gate electrode 140, the common electrode contact part (com-CNT) 141, and the direct contact part (D-CNT) 142. Mo, Ti, or an Mo/Ti alloy may be disposed at an upper and lower side of the gate material metal, and may be formed in a single layer, a multilayer, or an alloy layer, for example, a molybdenum-aluminum-molybdenum (Mo—Al—Mo) triple layer or a molybdenum-aluminum alloy layer.

Figure 3C:
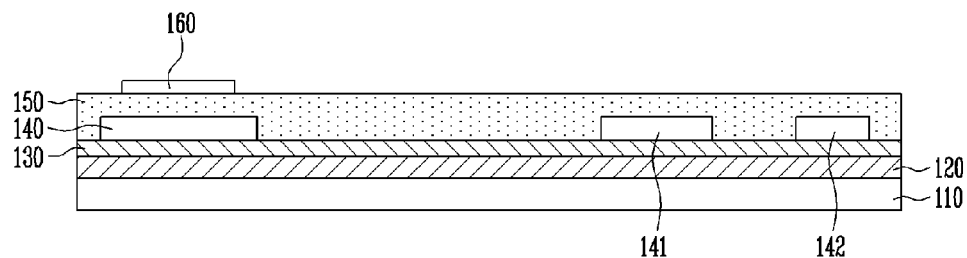

Referring to FIG. 3C, the gate insulating layer 150 is formed on the insulating substrate 110 on which the gate electrode 140 is formed. The gate insulating layer 150 covers and insulates the gate electrode 140, the gate line GL, the common electrode contact part (com-CNT) 141, and the direct contact part (D-CNT) 142 from conductive layers formed on the gate insulating layer 150. Forming conductive layers will be described below with reference to FIG. 3F.

A semiconductor layer 160 is formed by depositing a semiconductor thin film on the gate insulating layer 150 and patterning the semiconductor thin film by using a photoresist as a second mask (not illustrated). The semiconductor thin film may be patterned by, for example, dry etching or wet etching.

An Si-based material, for example, SiNx, SiOx, or SiONx, may be used as the gate insulating layer 150, and the gate insulating layer 150 may be formed by, for example, sputtering or CVD.

A conventional semiconductor layer may be used as the semiconductor layer 160, and be formed by using, for example, indium gallium zinc oxide (IGZO).

Figure 3D:
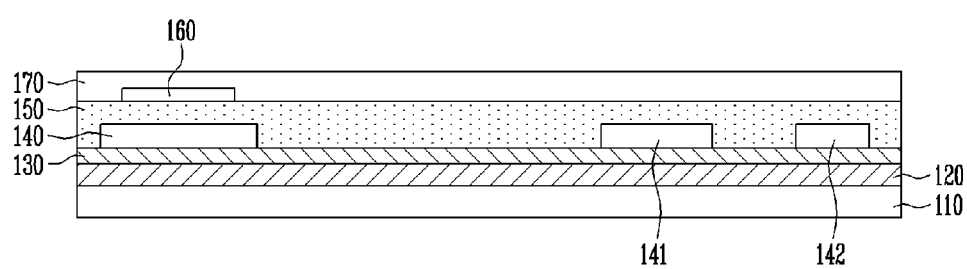
Figure 3E:
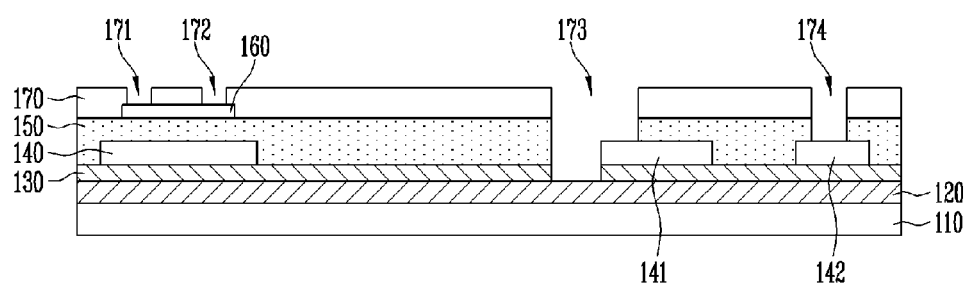

Referring to FIGS. 3D and 3E, a first contact hole 171, a second contact hole 172, a third contact hole 173, and a fourth contact hole 174 may be formed in a source electrode region, a drain electrode region, the common electrode contact part (com-CNT) 141, and the direct contact part (D-CNT) 142, respectively, by depositing an etch stopping layer 170 on the gate insulating layer 150 and the semiconductor layer 160, and patterning the etch stopping layer 170. The contact electrode contact part (com-CNT) 141 and the direct contact part (D-CNT) 142 may be connected through the third contact hole 173 and the fourth contact hole 174. The first to fourth contact holes 171 to 174 may be formed by patterning the etch stopping layer 170 by using photoresist as a third mask (not illustrated). The first contact hole 171 and the second contact hole 172 may be half tone (HT) treated when being formed.

SiOx may be used to form the etch stopping layer 170.

Figure 3F:
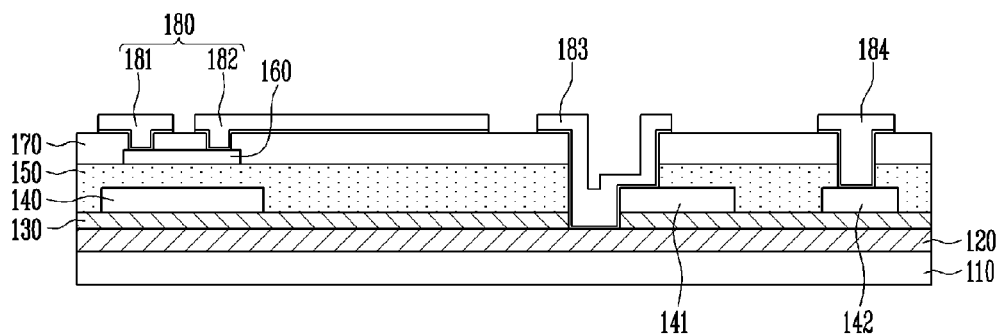

Referring to FIG. 3F, a source electrode 181 and a drain electrode 182 (or concurrently as a source and drain electrode 180) may be disposed on the etch stopping layer 170.

Figure 3G:
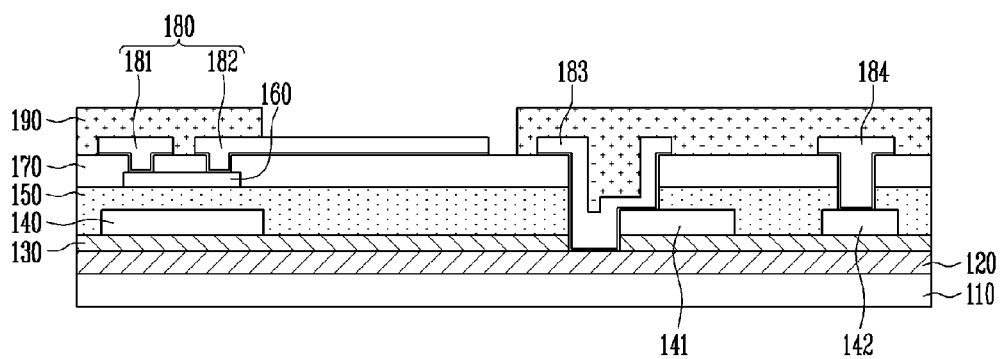
Figure 3H:
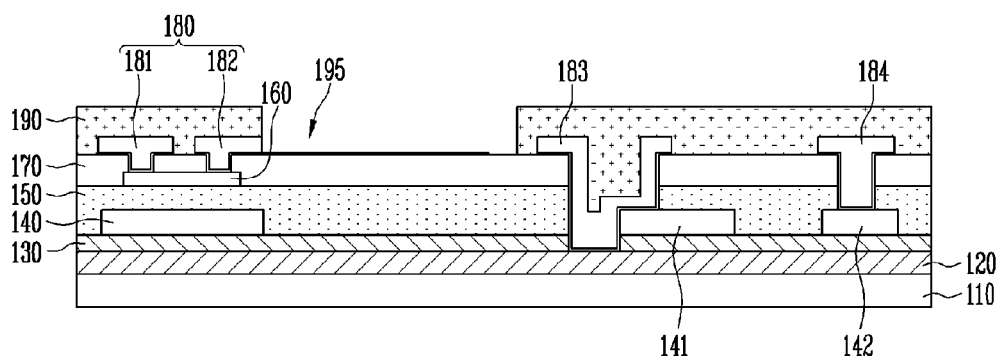

In forming the source and drain electrode 180, a source/drain metal may be deposited and patterned on a region including the source and drain electrode 180 and a pixel part 195 (see FIG. 3H).

The source/drain metal may include copper and a copper lower barrier including a TCO wire.

The source electrode 181 diverges from the data line DL. In plane view, the source electrode 181 overlaps a part of the semiconductor layer 160 through the first contact hole 171. The drain electrode 182 is spaced apart from the source electrode 181, and overlaps the remaining part of the semiconductor layer 160 through the second contact hole 172.

The display substrate 100 may further include conductive layers 183 and 184 extended from the drain electrode 182. The conductive layers 183 and 184 may be spaced apart from the source and drain electrodes 181 and 182, and disposed on the same layer on which the source and drain electrodes 181 and 182 are formed. The first conductive layer 183 may be electrically connected with the lower common electrode 120 through the third contact hole 173. A side of the common electrode contact part (com-CNT) 141 may contact the lower common electrode 120 through a pixel metal. The second conductive layer 184 may be electrically connected with the direct contact part (D-CNT) 142 through the fourth contact hole 174. The conductive layers 183 and 184 may be formed together with the source and drain electrodes 181 and 182.

The conductive layers 173 and 174 may be formed by patterning the source and drain electrodes 181 and 182 by using a fourth mask (not illustrated).

Referring to FIG. 3G, the display substrate 100 may further include a passivation layer 190 formed on the source and drain electrodes 181 and 182 and the conductive layers 183 and 184. The passivation layer 190 may be formed of an organic insulating material or an inorganic insulating material. The passivation layer 190 may be patterned to expose the pixel part 195 region using a fifth mask (not illustrated).

When the passivation layer 190 is patterned, the side of the common electrode contact part (com-CNT) 141 may contact the lower common electrode 120 through the pixel metal.

Referring to FIG. 3H, patterning the passivation layer 190 exposes the pixel part 195 region, which may be covered by the source/drain metal. The pixel part 195 may be formed by selectively wet etching the copper included in the source/drain metal disposed on the exposed pixel region. For example, the source/drain material may include copper and a TCO wire, and by selectively wet etching the cooper, a TCO based pixel part 195 may be formed.

The method of fabricating the display substrate used in a PLS mode liquid crystal display device as described above may implement a narrow bezel by forming the direct contact part (D-CNT) while using an etch stopper scheme. The method may reduce the number of photo masks used in the fabrication.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display substrate, comprising:
   a lower common electrode disposed on a substrate;
   an insulating layer disposed on the lower common electrode;
   a gate pattern comprising:
      a gate electrode disposed on the insulating layer; and
      a common electrode contact part and a direct contact part spaced apart from the gate electrode;
   a gate insulating layer disposed on the gate pattern;
   a semiconductor layer disposed on the gate insulating layer;
   an etch stopping layer disposed on the gate insulating layer;
   source and drain electrodes disposed on the etch stopping layer;
   a pixel part extending from the source and drain electrodes;
   a first conductive layer connected to the common electrode contact part;
   a second conductive layer connected to the direct contact part; and
   a passivation layer disposed on the source and drain electrodes, the first conductive layer, and the second conductive layer,
   wherein the pixel part comprises a transparent conducting oxide (TCO) wire forming the source and drain electrodes, and
   wherein the source and drain electrodes comprise a material different from the pixel part.

2. The display substrate of claim 1, wherein the lower common electrode is deposited on the substrate covering the entire substrate without being patterned.

3. The display substrate of claim 1, wherein the lower common electrode and the pixel part comprise a transparent conducting oxide (TCO)-based metal.

4. The display substrate of claim 1, wherein the insulating layer and the gate insulating layer comprise a Si-based insulating layer.

5. The display substrate of claim 1, wherein the gate electrode comprises at least one of copper, aluminum, molybdenum, tungsten, titanium, chrome, and an alloy thereof.

6. The display substrate of claim 1, wherein:
the source and drain electrodes comprise copper and a copper lower barrier comprising the TCO wire; and
the pixel part comprises only the TCO wire.

7. The display substrate of claim 1, wherein the pixel part is connected to the drain electrode or the source electrode via the TCO wire.

8. The display substrate of claim 1, wherein the pixel part is directly disposed on the etch stopping layer.

9. The display substrate of claim 1, wherein the common electrode contact part is connected to the lower common electrode via a side surface of the common electrode contact part that is substantially perpendicular to a top surface of the substrate.

10. The display substrate of claim 1, wherein the first conductive layer, the second conductive layer, and the pixel part are spaced apart from each other by the passivation layer.

11. The display substrate of claim 1, wherein the entire etch stopping layer is disposed below the source and drain electrodes.

12. The display substrate of claim 1, wherein a portion of the source or drain electrodes disposed on the etch stopping layer has a thickness greater than a thickness of the pixel part disposed on the etch stopping layer.

13. The display substrate of claim 1, wherein a distance between the display substrate and a top surface of the source or drain electrodes is greater than a distance between the display substrate and a top surface of the pixel part.

* * * * *